United States Patent [19]

Chang et al.

[11] Patent Number: 5,668,544
[45] Date of Patent: Sep. 16, 1997

[54] COMPOUND TYPE OF KEYBOARD DETECTOR

[75] Inventors: Herman Chang; Yueh-Mei Hou, both of Hsinchu, Taiwan

[73] Assignee: Holtek Microelectronics, Inc., Hsinchu, Taiwan

[21] Appl. No.: 607,111

[22] Filed: Feb. 26, 1996

[51] Int. Cl.$^6$ ............................................. H03K 17/94
[52] U.S. Cl. ............................ 341/26; 341/20; 364/189
[58] Field of Search ............................ 341/26, 22, 23, 341/20; 364/189

[56] References Cited

U.S. PATENT DOCUMENTS 5,463,386  10/1995  Wu .................................................. 341/26

Primary Examiner—Jeffery Hofsass
Assistant Examiner—Albert K. Wong
Attorney, Agent, or Firm—W. Wayne Liauh

[57] ABSTRACT

A compound type keyboard detector is disclosed. It comprises a time-sequencing generator, a keyboard scanner, a column input port and a row input port, a column lock and a row lock, a keyboard-synchronization detector, a keyboard detector and a keyboard decoder. With the unique design of the keyboard detector in conjunction with the various circuits that are associated therewith, a given number of pins can be used for a relatively greater number of input keys, or a smaller number of pins can be used for relatively complicated input keyw. This type of keyboard detector is good for small IC products, and can reduce the manufacturing cost thereof.

1 Claim, 8 Drawing Sheets

COMPOUND TYPE OF KEYBOARD DETECTOR

BACKGROUND OF THE INVENTION

1. Field of the Invention

This invention relates to a compound type of keyboard detector, and particularly to a detector device, whereby a given number of pins can be used for a relatively greater number of keys.

2. Description of the Prior Art

Most of the conventional keyboard detectors are one-dimensional type (i. e., a direct mapping type) (i.e., a direct mapping type) as shown in FIG. 1, or a two-dimensional type (i.e., a matrix type) as shown in FIG. 2 to be connected with a keyboard; if more keys are to be added, the number of pins of the IC has to be increased accordingly. In terms of an IC package, more pins will cause a higher package cost, i.e., the manufacturing cost thereof will be increased.

SUMMARY OF THE INVENTION

The prime of the present invention is to provide a keyboard detector, which can have a given number of pins of an IC used relatively for more number of keys, i.e., a given number of keys may be connected with a less number of pins; therefore, the package cost of IC products will be reduced so as to lower the manufacturing cost thereof.

DETAILED DESCRIPTION

Figure 3:
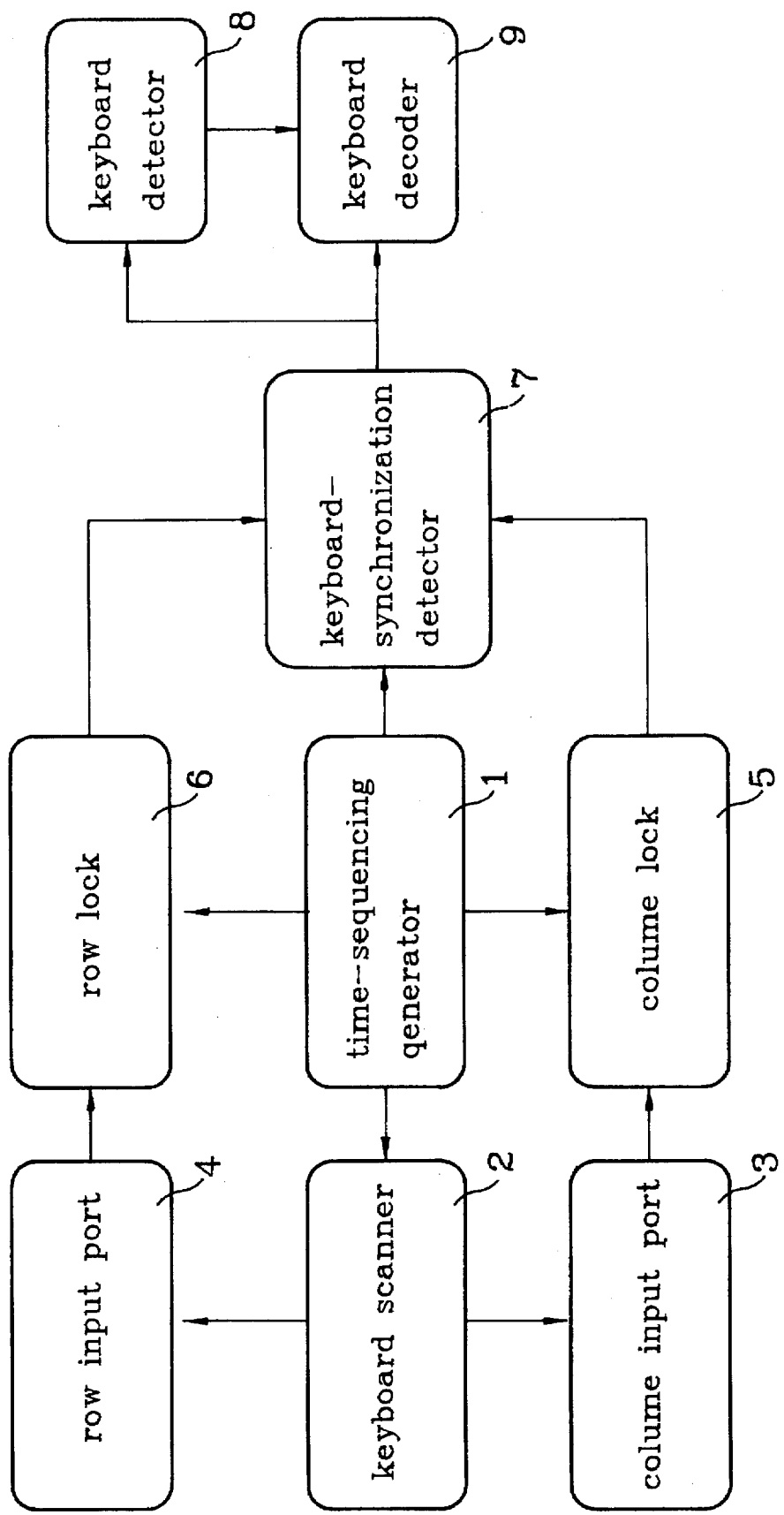
FIG. 3 is a block diagram, showing a preferred embodiment according to the present invention.
Figure 4A:
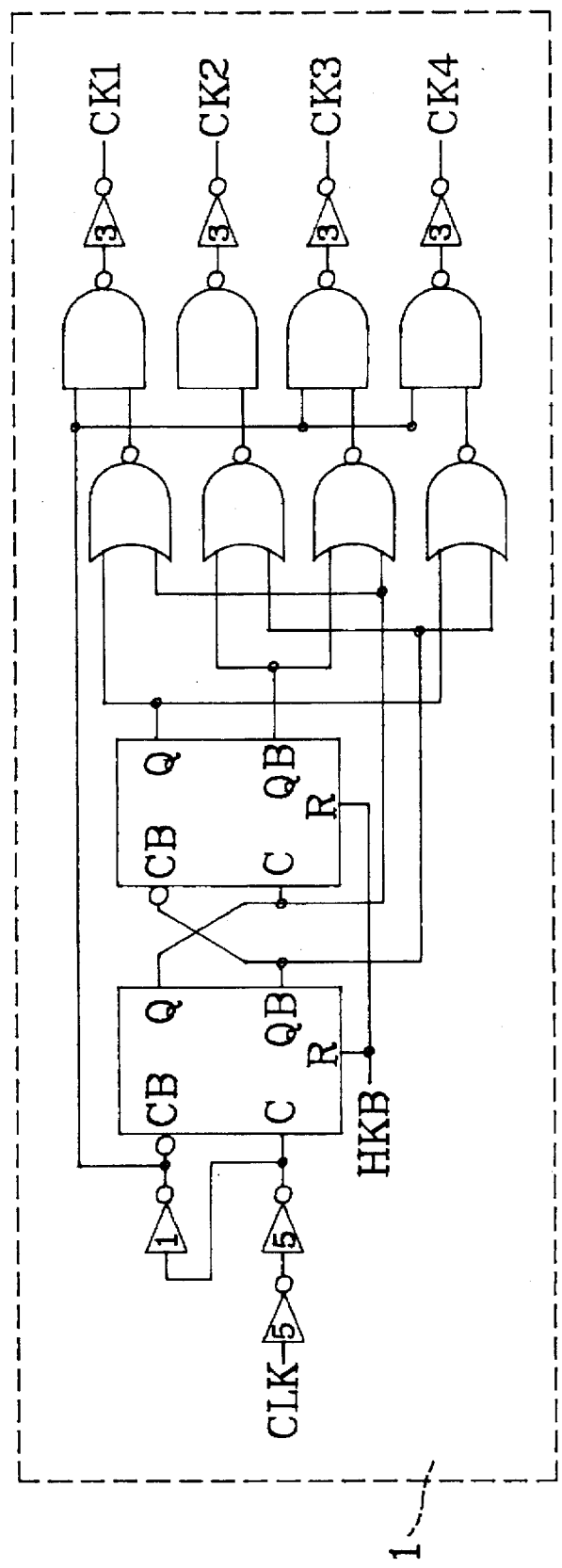
FIG. 4 is a schematic circuit diagram, which is corresponding to the block diagram FIG. 3, showing a preferred embodiment according to the present invention.
Figure 4B:
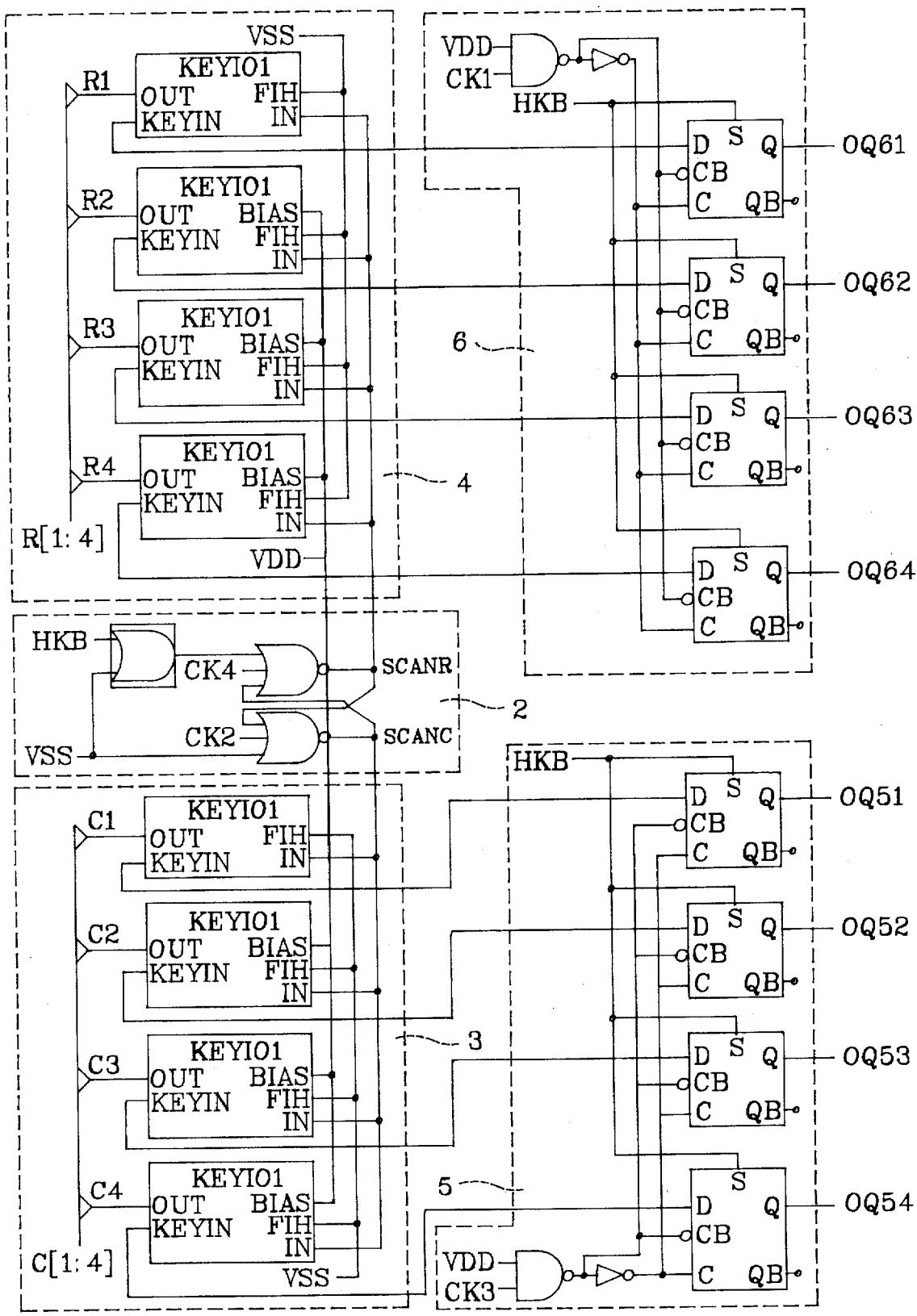
Figure 4C:
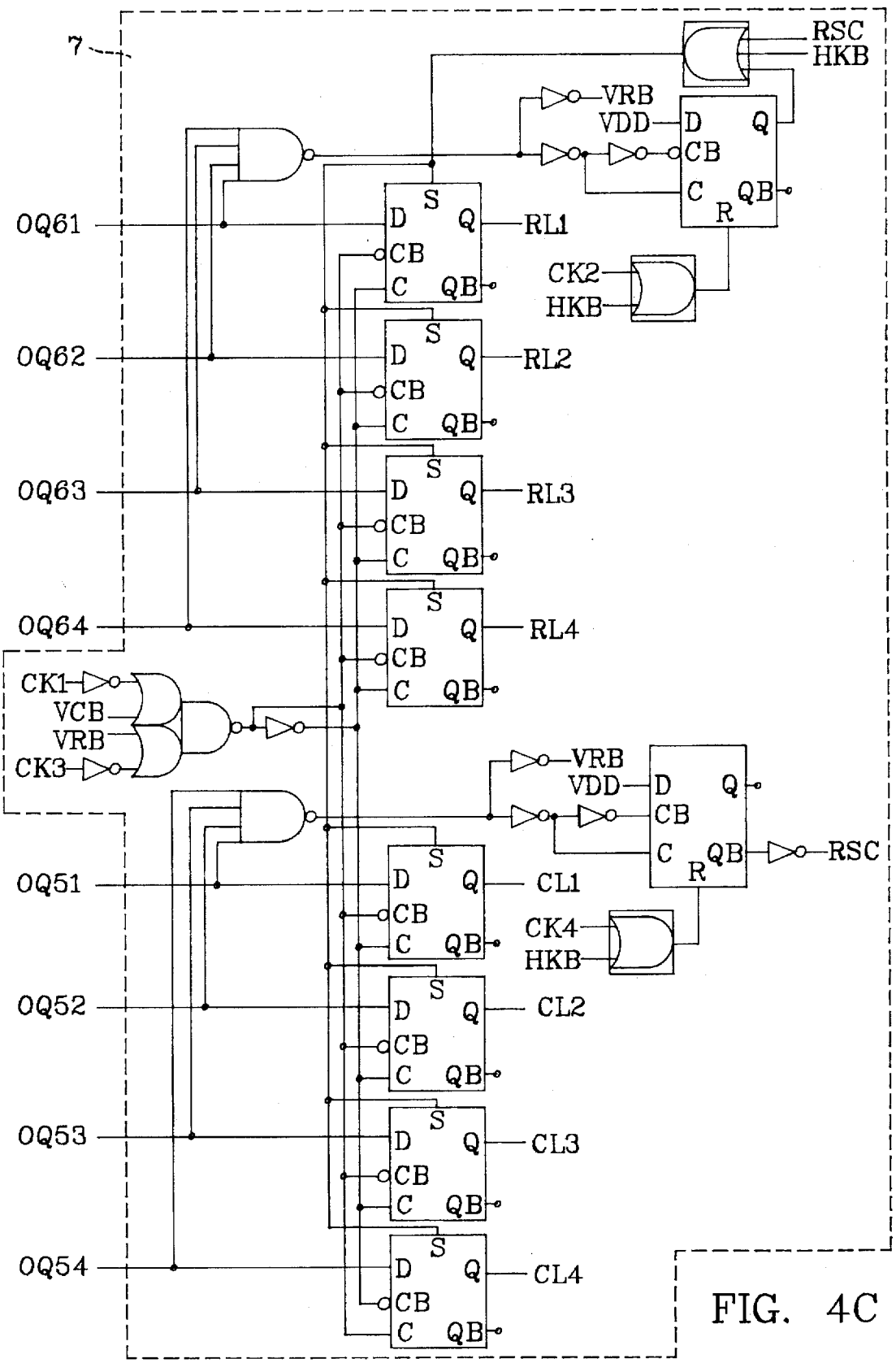
Figure 4E:
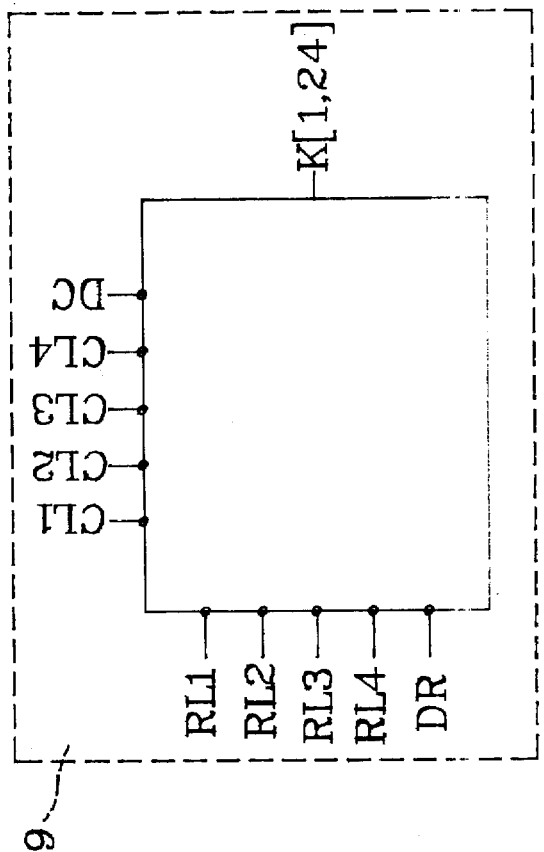
Figure 4D:
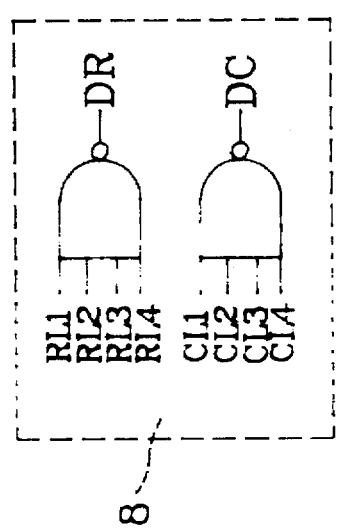

The object, features and functions of the present invention are further described with the accompanying drawings as follows:

Referring now to FIGS. 3 and 4, FIG. 3 is a block diagram, showing a preferred embodiment according to the present invention, and FIG. 4 is a schematic circuit diagram that is corresponding to the block diagram FIG. 3 showing a preferred embodiment according to the present invention. The time-sequencing generator 1 which has a system clock CLK and an enabling signal HKB inputs, generates the time-sequencing output signals CK1 to CK4 which are transmitted to the keyboard scanner 2, the column lock 5, the row lock 6, and the keyboard-synchronization detector 7. The keyboard scanner 2 has input terminals connected to an enabling signal HKB, the time-sequencing output signals CK2, and CK4 of time-sequencing generator 1, so as to generate the outputs of a row-scanning signal SCANR and a column-scanning signal SCANC, which are then sent to the row input port 4 and the column input port 3, respectively. The input terminals of column input port 3 are connected to a key-in signal VSS and a column-scanning signal SCANC to produce a column output signals Ci (i=1, 2, 3, 4), while the input terminals of row input port 4 are connected to a key-in signal VSS and a row-scanning signal SCANR to produce a row output signals Rj (j=1, 2, 3, 4). The input terminals of the column lock 5 and the row lock 6, which can lockout the signal data, are connected to an enabling signal HKB, the time-sequencing output signals CK3 and CK1 of the time-sequencing generator 1, respectively. Then the various column output signals Ci and the row output signals Rj can be relayed to a keyboard-synchronization detector 7 through the column lock 5 and the row lock 6. The input terminals of keyboard-synchronization detector 7 which are connected to an enabling signal HKB and the time-sequencing output signals CK1 to CK4 of the time-sequencing generator 1, produces column synchronization output signals CLi and row synchronization output signals RLj, which are transmitted to the keyboard detector 8 and the keyboard decoder 9.

Figure 6:
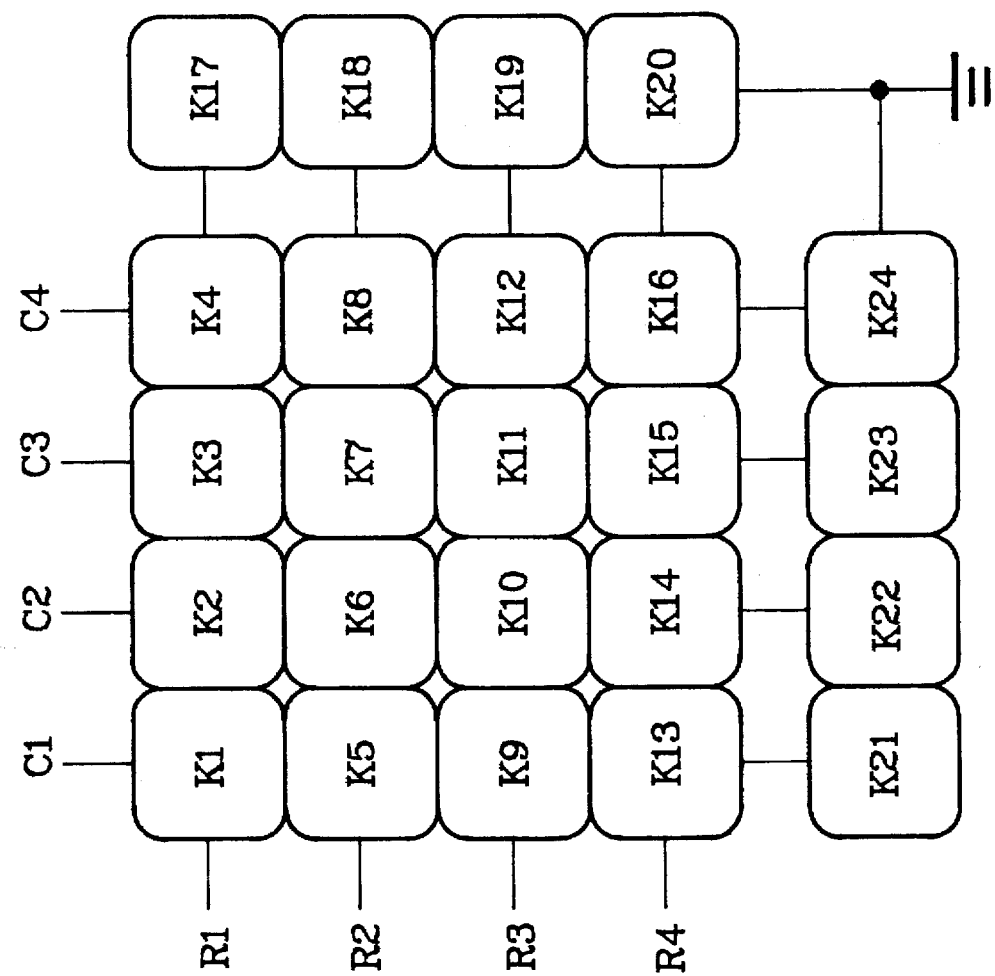
FIG. 6 is a keyboard configuration diagram of a preferred embodiment according to the present invention.

The keyboard detector 8, which has eight input terminals and is connected to the column synchronization signals CLi and the row synchronization signals RLj, generates a column detecting signal DC and a row detecting signal DR, to determine whether the extended keys (K 17 to K24) of FIG. 6 have been pressed or not. Finally, the column detecting signal DC, the row detecting signal DR, the column synchronization signals CLi and the row synchronization signals RLj are connected to the input terminals of keyboard decoder 9 to encode and display an output signal, that, which key (K1 to K24) is pressed. A compound type of keyboard detector of the present invention which can detect more keys without increasing the number of IC pins is then achieved.

Figure 5:
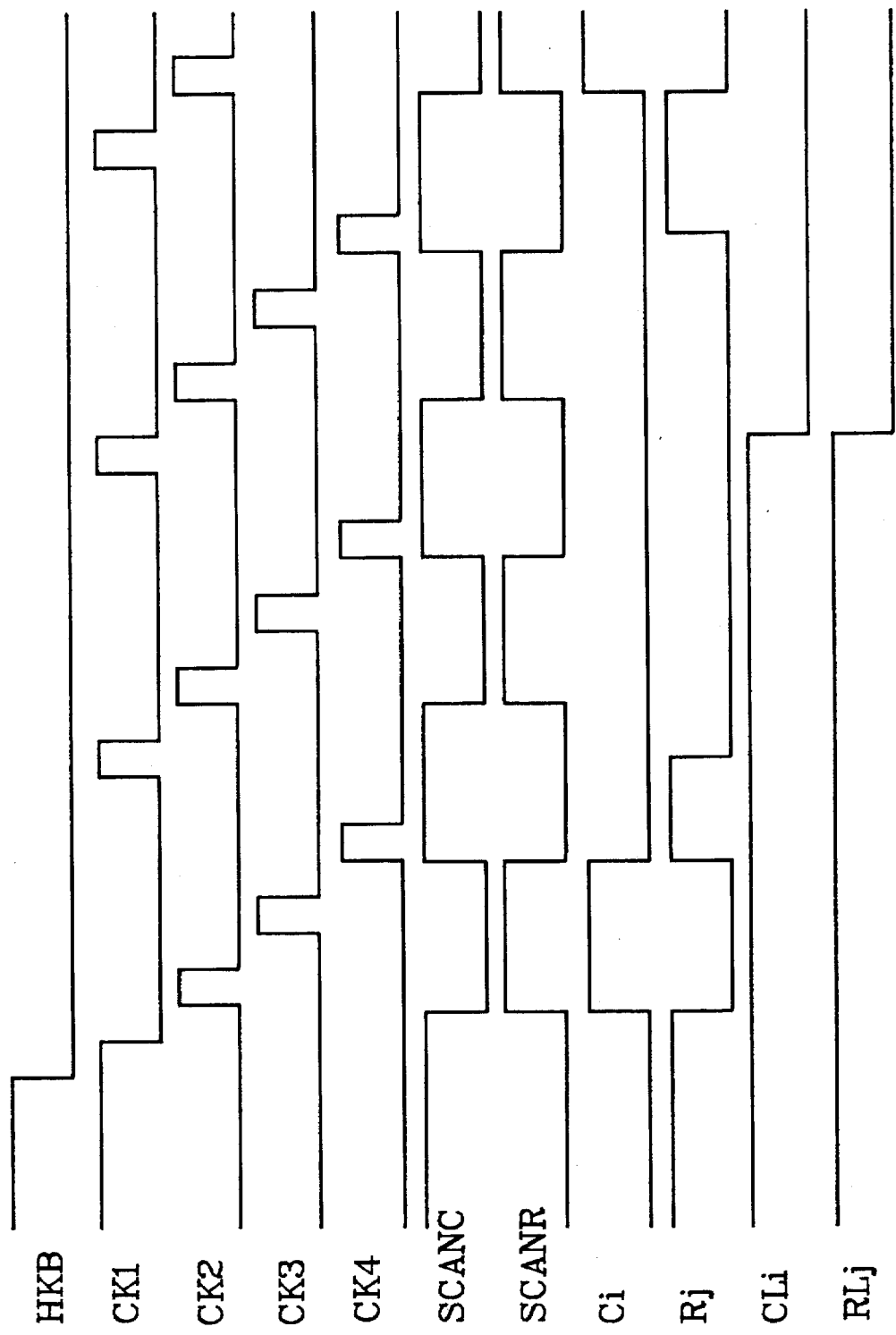
FIG. 5 is a time-sequencing diagram of a preferred embodiment according to the present invention.

FIG. 5 is a time-sequencing diagram of the preferred embodiment according to the present invention. When the enabling signal HKB of the circuit is in high state, the present invention does not perform key-in scanning, and all signals remain in their default states, which are the column-scanning signal SCANC in high state, the column signal Ci in low state, the row-scanning signal SCANR in low state, and the row signal Rj in high state. When the enabling signal HKB is changing form high state into low state, the present invention starts to operate, and then the time-sequencing signals CK1 to CK4 and the signals form various stages of the present invention will function as shown in FIG. 5. When a key is pressed (supposing the time-sequencing signal CK1 is in high state), the corresponding row signal Rj will be set to low state. Since the time-sequencing signal CK1 is in high state, the row signal Rj is locked in its initial state (high or low) in the row lock 6. As soon as the time-sequencing signal CK2 is in high state, the row-scanning signal SCANR goes to high state, changing the row signal Rj to low state; meanwhile the column-scanning signal SCANC goes to low state, changing the column signal Ci to high state. If the aforesaid key-pressing condition continues, the corresponding column signal Ci is set to low state. When the time-sequencing signal CK3 is in high state, the column signal Ci is locked in low state also in the column lock 5. When the time-sequencing signal CK4 is in high state, all states are reset to their default states again. The full cycle as mentioned above runs repeatedly.

Figure 1:
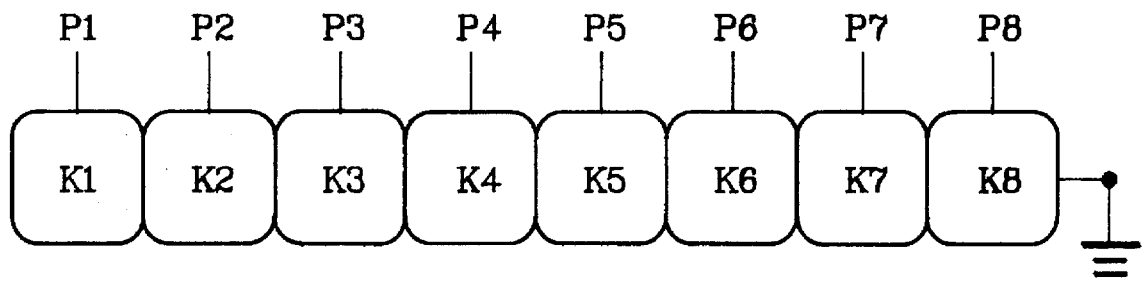
FIG. 1 is a conventional one-dimensional keyboard configuration diagram.
Figure 2:
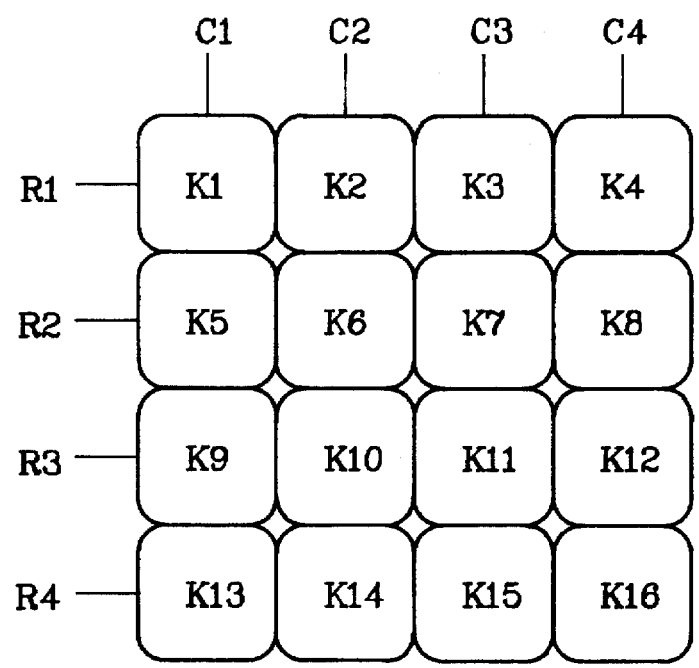
FIG. 2 is a conventional two-dimensional keyboard configuration diagram.

After one cycle is completed (i.e., the time-sequencing signals from CK1 to CK4 all running once), the column lock 5 and the row lock 6 record the key-in values of a column and a row, respectively. When the time-sequencing signal CK1 is in high state, the key-in value is written into the keyboard-synchronization detector 7. Referring now to FIG. 6 [FIG. 4], it illustrates the keyboard configuration of the present invention. If one of the keys K1 to K16 is pressed, the key-in signal is sent to the keyboard decoder 9 directly to show which key is pressed. If one of the extended keys K17 to K24 is pressed, the key-in signal has to be decoded through the keyboard detector 8. As shown in FIG. 4 [FIG. 2], when RL2 and CL2 are in low state, it indicates the key K6 being pressed. When CL3 is in low state, and RL1 to RL4 are all in high state, it indicates the row detecting signal DR of the keyboard detector 8 being in low state; by means of a row detecting signal DR, it indicates the K23 being pressed. A comparison can be made between the present invention and the conventional one-dimension or two-dimension keyboards (as shown in FIGS. 1 and 2; as shown in FIG. 1, the eight pins can connect with eight keys only. As shown in FIG. 2, the eight pins can only connect with 16 keys. According to the present invention (as shown in FIG. 6), the eight pins can connect with 24 keys; therefore, the present invention can increase the number of keys considerably.

In brief, the present invention can have a minimum number of pins connected with a maximum number of keys, or requires less pins for a given number of keys; in other words, the present invention can have the manufacturing cost thereof reduced, and can increase the competitive capability of the products. It is deemed to have a higher industrial value and novelty.

We claim:

1. A compound type of keyboard detector comprising:

a time-sequencing generator comprising: means to an enabling signal and system clock inputs and means for generating first through fourth time-sequencing output signals during one complete cycle;

a keyboard scanner comprising: input terminals respectively connected to said said enabling signal and said second and fourth time-sequencing output signals from said time-sequencing generator, and means for outputting a column-scanning signal and a row-scanning signal;

a column input port comprising: input terminals respectively connected to a column key-in signal and said column-scanning signal from said keyboard scanner, and means for outputting a column output signal;

a row input port comprising input terminals respectively connected to a row key-in signal and said row-scanning signal from said keyboard scanner, and means for outputting a row output signal;

a column lock comprising input terminals respectively connected to said enabling signal, said third time-sequencing output signal from said time-sequencing generator, and output terminals of said column input port, means for locking said column input signals, and means for outputting column-locked output signals;

a row lock comprising input terminals respectively connected to said enabling signal, said first time-sequencing output signal from said time-sequencing generator, and output terminals of said row input port, means for locking said row input signals, and means for outputting row-locked output signals;

a keyboard-synchronization detector comprising input terminals respectively connected to said the enabling signal, said time-sequencing output signals from said time-sequencing generator for receiving an enabling signal and a time-sequencing signal, and output terminals of said column lock and said row lock, and means for outputting column synchronization signals and row synchronization signals;

a keyboard detector comprising input terminals respectively connected to said keyboard-synchronization detector for receiving said column synchronization signals and said row synchronization signals, and means for outputting a column detecting signal and a row detecting signal; and a keyboard decoder comprising input terminals respectively connected to said keyboard detector and said keyboard-synchronization detector for receiving said column detecting signal, said row detecting signal, said column synchronization signals, and said row synchronization signals, and decoding means for generating means to indicate which key has been pressed.

* * * * *